METHOD FOR PRODUCING A STABLE SURFACE PROTECTION FOR SEMICONDUCTOR COMPONENTS

Filed April 21, 1971

United States Patent Office 3,788,895 Patented Jan. 29, 1974

3,788,895

METHOD FOR PRODUCING A STABLE SURFACE PROTECTION FOR SEMICONDUCTOR COMPONENTS

Rigobert Schimmer and Jurgen Messerschmidt, Belecke, Germany, assignors to Licentia Patent-Verwaltungs-G.m.b.H., Frankfurt am Main, Germany

Filed Apr. 21, 1971, Ser. No. 136,223
Claims priority, application Germany, Apr. 21, 1970, P 20 19 099.2
Int. Cl. H01l *3/00*
U.S. Cl. 117—218 22 Claims

ABSTRACT OF THE DISCLOSURE

A polymer coating disposed on a semiconductor body and connected to the semiconductor body by a coupling compound having functional groups reacting with the semiconductor body and the polymer coating. Exemplary functional groups which react with the semiconductor body are, e.g., methoxy, ethoxy and acetoxy groups; these are regarded as anorganic-functional groups. Exemplary functional groups which react with the polymer coating are, e.g. vinyl, amino, alkylamino, arylamino, epoxy and mercapto groups; these are regarded as organo-functional groups.

BACKGROUND OF THE INVENTION

The present invention relates to a method for producing a stable surface protection for a semiconductor component whose surface is coated by a polymer serving as a protective material.

The critical locations of semiconductor components made, for example, of silicon or germanium lie primarily in the area of the pn-junction(s). The regions where pn-junctions intersect the surface of a semiconductor body are particularly sensitive and often create problems.

Semiconductor components with high resistance to breakdown under reverse biasing of their pn-junctions, which component are commonly desired and which require high-resistivity material, are espeially endangered in this connection, because the stability of high-resistivity material can be so easily influenced in an undesired manner.

The instability of the resistance to breakdown is attributed, for example, to external impurity charge carriers formed from ions of adsorbed molecules. Also, reactions of surface atoms of a semiconductor body with impurities perhaps coming from the atmosphere can lead to enriched and depleted edge layers which likewise can cause instabilities.

To prevent such phenomena, it is known to provide the surface of a semiconductor body with a protective coating, especially in those portions of the surface where pn-junctions emerge. Polymer substances are examples of the materials used for such coatings, for example silicone resin or silicone rubber. Since, however, these coatings do not often enough lead to the desired stability, especially in the case of semiconductor components having a high reverse breakdown voltage, it has been attempted to improve their stabilizing and passivating action by the addition of other materials to the silicone compounds. Examples of such other materials are alizarin and fluorescein.

High demands can, however, not be met even when these additive-containing silicone compounds are employed.

SUMMARY OF THE INVENTION

An object of the present invention, therefore, is to provide a method for improving the surface protection of semiconductor components so that the stability of their breakdown under reverse bias can meet high demands.

This as well as other objects which will become apparent in the discussion that follows are achieved, according to the present invention, by a method for producing a stable surface protection for a semiconductor component provided with a polymer coating serving as a protective material. The method includes connecting the polymer coating to the body of the semiconductor with a coupling compound having functional groups reacting with both the semiconductor body and the polymer coating.

DESCRIPTION OF THE PREFERRED EMBODIMENTS

Figure 1:
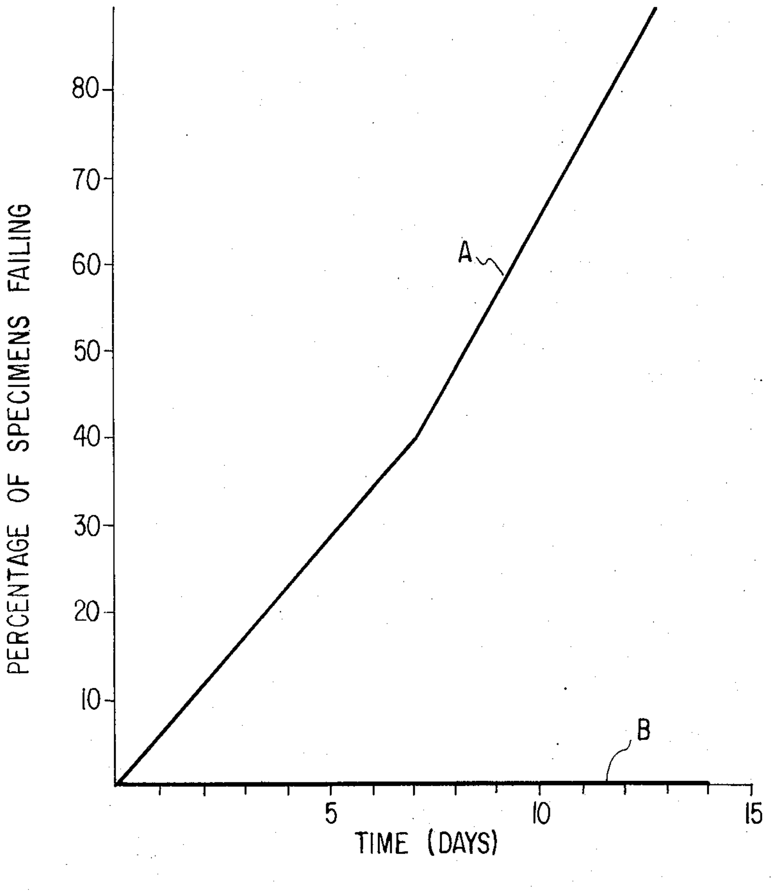
FIG. 1 is a graph of time (days) versus percentage of specimens failing, showing results of comparative blocking life tests with surface protected thyristor wafers tested with a continuously applied blocking voltage of 400 volts at 125° C.

It has proven advantageous to utilize as the coupling compound a material having at least one organo-functional group and at least one anorgano-functional group. Example of organo-functional groups are vinyl, amino, alkylamino, arylamino, epoxy, and mercapto groups and the like. Examples of anorgano-functional groups are methoxy, ethoxy, and acetoxy groups and the like. Examples of such a coupling compound are an appropriately substituted silane or an appropriately substituted low-molecular-weight, e.g. average molecular-weight between 500 and 1000, silicone. These are applied in, for example, an alcohol, e.g. ethyl-, methyl- or isopropyl alcohol, or xylene solution or suspension in a concentration of about 0.1 to 20 weight-percent, preferably about 5 weight-percent.

The coupling component is applied to the semiconductor body, and then the protective material polymer coating is applied over the coupling compound, followed by curing.

In a modification, the coupling compound is first mixed with the polymer coating material, and the mixture is applied to the semiconductor body and cured.

The coupling component is present in a concentration of about 0.01 to 10 weight-percent, based on the total mixture of coupling component plus polymer coating material. It preferably has a concentration of about 0.15 weight-percent.

The surface protection for semiconductor components obtained according to the present invention has optimum characteristics. Even when placed conditions of higher temperature and when loaded for long periods of time under maximum temperatures just below those initiating breakdown, no instability is noted. It has been determined that when the surface protection according to the present invention is used, a diffusion of impurities through the polymer coating to the semiconductor surface is prevented, because the coupling compound fixes the diffusing impurities. Among other advantages, there is obtained the manufacturing advantage that components can be produced using copper, for example for the housing, without creating any consequent danger of malfunction.

TABLE 1

| Coupling compound | Functional groups: Organo-functional group | Functional groups: Anorgano-functional group | Chemical designation and structural formula | Molecular weight | Supplier |
|---|---|---|---|---|---|
| A 1100 | Amino- | Ethoxy- | Gamma-aminopropyl-triethoxy-silane $H_2N—C_3H_6—Si—(O—C_2H_5)_3$. | 221 | Union Carbide. |
| A 1120 | Diamino | Methoxy | N-beta-aminoethyl-gamma-aminopropyl-trimethoxy-silane $H_2N—C_2H_4—NH—C_3H_6—Si—(O—CH_3)_3$. | 222 | Do. |
| Z-6020 | | | In conformity with A 1120 | | Dow Corning Corporation. |
| Z-6040 | Epoxy | Methoxy | Gamma-glycidoxypropyl-trimethoxy-silane $\underbrace{H_2C——CH}_{O}—CH_2—O—C_3H_6—Si—(O—CH_3)_3$. | 236 | Do. |

It is assumed that the success of the surface protection according to the present invention results because the anorgano-functional part of the coupling compound enters into a chemical bond with the oxides or hydroxides present on the surface of the semiconductor body, while the organo-functional part enters into a chemical bond with the silicon-organic or purely organic polymer coating.

Possibly, there first occurs a hydrolysis of the anorgano-functional group by reaction with water in the air or with adsorbed water. The hydrolyzed coupling compound then bonds with a hydrozyl group on the semiconductor surface via a condensation reaction. Following this initiating reaction, either other hydroxyl groups of the semiconductor surface or other hydrolyzed groups of the coupling compound are bonded.

The chemical reaction of the organo-functional group of the coupling compound with the functional groups of the surface protective polymer coating, for example of silicone rubber or silicone resin, proceeds likewise by a condensation reaction or by an addition reaction during the curing process.

It should be noted, however, that the success of the present invention does not depend on the correctness of the preceding theoretical explanation of the way in which it works.

Further illustrative of the invention is the following exemplary information:

In Table 1 art given designations of product, exact chemical designations, structural formulas, molecular-weights and the suppliers of four coupling compounds along with their organo and anorgano functional groups.

Another coupling compound which has proven an example of a preferred embodiment of this invention is the low molecular silicone product Silan AP 133 which is supplied by the Union Carbide Corporation. This coupling compound is dissolved in a mixture of methyl and ethyl alcohol. Its molecular-weight is between 500 and 1000.

AP 133 is applied to the semiconductor body preferably in, for example, a solution with equal portions of methyl and ethyl alcohol in a concentration of 5 weight-percent, before the resin being used for the polymer coating, for example, a silicone rubber, is applied over the coupling compound.

At room temperature, it takes only 15 minutes to dry the compound. In a modification, the coupling compound is first mixed with the silicone rubber X 30 925 (molecular weight of silicone rubber is between $10^5$–$10^6$) which is supplied by the Dow Corning Corp. and then the mixture is applied to the semiconductor body. This mixture provides a stable surface protection for semiconductor bodies. X 30 925 contains a catalyzing peroxide and hardens at elevated temperatures. A mixture of 100 g. silicone rubber X 30 925, 37 g. xylol and 3 g. Silan AP 133 (in a solution as specified above) has been applied to a semiconductor body and then has been cured in a drying chamber.

In the following Table 2 curing time periods are given in hours along with temperatures at which curing of the mixture has been accomplished.

TABLE 2

| | |
|---|---|
| 6 hours at | Room temperature. |
| 1 hour at | 50° C. |
| 1 hour at | 70° C. |
| 1 hour at | 90° C. |
| 1 hour at | 120° C. |
| 1 hour at | 150° C. |
| 3 hours at | 200° C. |

With thyristor wafers submitted to a surface protection process as outlined above, a blocking life test has been carried out with a continously applied blocking voltage of 400 volts at 125° C., as well as a thermal stability test at 175° C. These tests have also been carried out with thyristor wafers, to which has been applied the X 30 925 coating alone. The results of these comparative tests are represented by the graphs of FIGS. 1 and 2 respectively, to point out the improved stability of surface protection when using the present invention (B-lines as compared with A-lines).

Referring firstly to FIG. 1, for the blocking life test carried out with a continuously applied blocking voltage of 400 volts at 125° C., curve A is a plot of results with thyristor wafers which have a coating consisting of 100 g. silicone rubber X 30 925 and 37 g. xylol.

Curve B is a plot of results with thyristor wafers which have a coating consisting of 100 g. silicone rubber X 30 925 and 37 g. xylol mixed with 3 g. of the coupling compound Silan AP 133.

Figure 2:
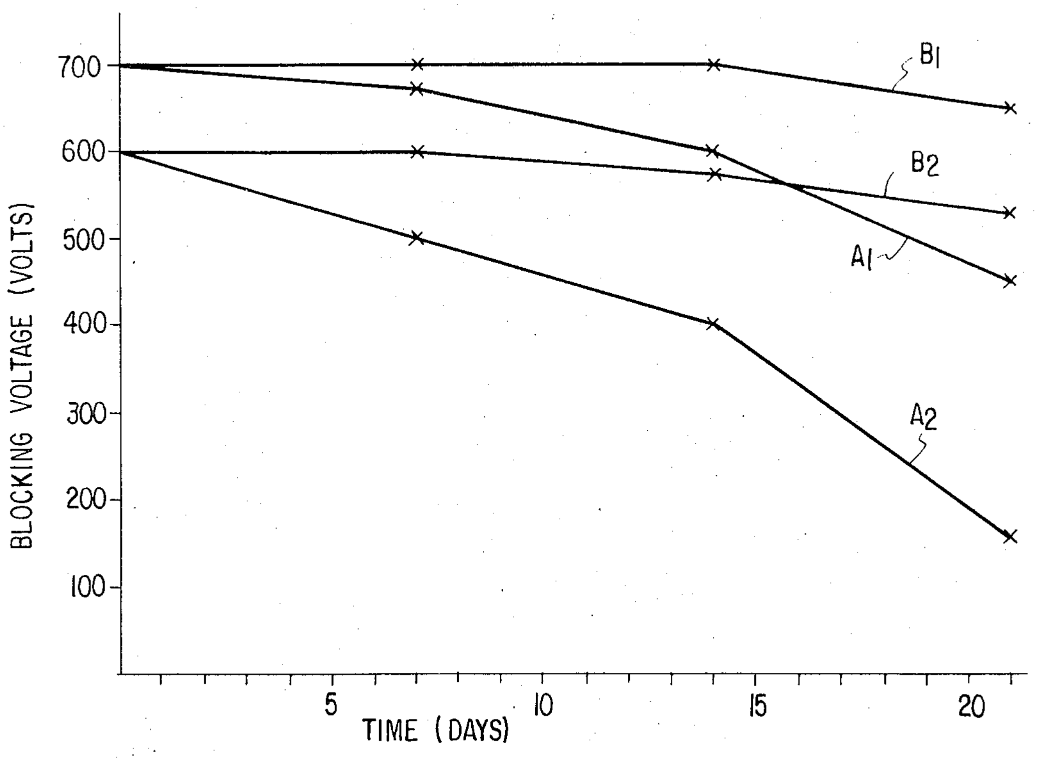
FIG. 2 is a graph of time (days) versus blocking voltage (volts), showing results of comparative thermal stability tests with surface protected thyristor wafers tested at a continuously maintained constant temperature of 175° C.

FIG. 2 shows the results of comparative thermal stability tests on surface protected thyristor wafers tested at a continuously maintained constant temperature of 175° C. In FIG. 2, the designations A and B indicate the same surface treatment as in FIG. 1.

Curves $A_1$ and $B_1$ are plots of results which correspond to the 50%-values of the blocking voltage error function.

Curves $A_2$ and $B_2$ are plots of results which correspond to the 20%-values of the blocking voltage error function. The aforesaid percentages are shares of the totality of tested thyristor wafers.

It should be pointed out that stability of surface protection has also been found improved, when the X 30 925-silicone rubber or another silicone product such as, for example, the silicone resin M 15 which is supplied by Th. Goldschmidt, Essen, Germany, is mixed with any coupling compound as specified in Table 1.

Table 3 compares blocking life test results with thermal stability test results for tests with thyristor wafers to which a coating, mixed with any coupling compound as specified in Table 1, is applied. In the column, thermal stability test, 50%- and 20%-values of the blocking voltage decrease result from an error function curve that has been plotted after a test time period of 21 days.

TABLE 3

| Coupling compound | Coating material | Thermal stability test at 175° C.; decrease of the blocking voltage after 21 days | | Blocking life test (400 V, 125° C.), percentage of specimens failing after— | | | |
|---|---|---|---|---|---|---|---|
| | | 50% | 20% | 7 days | 14 days | 21 days | 28 days |
| Without coupling compound | 100 g. silicone rubber × 30925, 37 g. xylol | 250 V | 450 V | 40 | 100 | | |
| A 1100 | 100 g. silicone rubber × 30925, 37 g. xylol, 1 g. A 1100 | 80 V | 120 V | 0 | 0 | 0 | 0 |
| A 1120 | 100 g. silicone rubber × 30925, 37 g. xylol, 1 g. A 1120 | 100 V | 160 V | 0 | 20 | 40 | 40 |
| Z-6040 | 100 g. silicone rubber × 30925, 37 g. xylol, 1 g. Z-6040 | 80 V | 100 V | 0 | 0 | 0 | 0 |
| AP 133 | 100 g. silicone rubber × 30925, 37 g. xylol, 3 g. AP 133 | 50 V | 70 V | 0 | 0 | 0 | 0 |

It will be understood that the above description of the present invention is susceptible to various modifications, changes and adaptations, and the same are intended to be comprehended within the meaning and range of equivalents of the appended claims.

DEFINITIONS

Organo-functional group

An *organo-functional* group is a part of a coupling compound which enters in a chemical bond with the silicon-*organic* (for example silicone rubber) or the purely *organic* (for example resin) polymer coating for surface protection.

Anorgano-functional group

An *anorgano*-functional group is a part of a coupling compound which enters in a chemical bond with the *oxides or hydroxides* present on the surface of the semiconductor body.

Example: Coupling compound Silan Z-6040

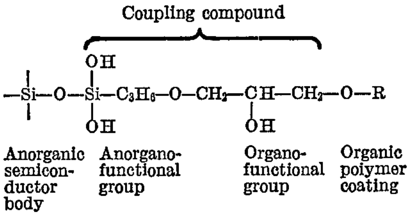

Comment

In the terms organo- and anorgano-functional the designations organo and anorgano refer to the chemical affinity but not to the constitution of coupling compound.

We claim:

1. Method for producing a stable surface protection for a semiconductor body, comprising providing said body with a protective polymer coating, and chemically bonding the polymer coating to the semiconductor body with a coupling compound having a functional group which reacts with the semiconductor body and a functional group which reacts with the polymer coating.

2. Method as claimed in claim 1, wherein said coupling compound is a material with at least one organo-functional group and at least one anorgano-functional group.

3. Method as claimed in claim 2, wherein said material contains, as an organo-functional group, a vinyl group.

4. Method as claimed in claim 2, wherein said material contains, as an organo-functional group, an amino group.

5. Method as claimed in claim 2, wherein said material contains, as an organo-functional group, an alkylamino group.

6. Method as claimed in claim 2, wherein said material contains, as an organo-functional group, an arylamino group.

7. Method as claimed in claim 2, wherein said material contains, as an organo-functional group, an epoxy group.

8. Method as claimed in claim 2, wherein said material contains, as an organo-functional group, a mercapto group.

9. Method as claimed in claim 2, wherein said material contains, as an anorgano-functional group, a methoxy group.

10. Method as claimed in claim 2, wherein said material contains, as an anorgano-functional group, an ethoxy group.

11. Method as claimed in claim 2, wherein said material contains, as an anorgano-functional group, an acetoxy group.

12. Method as claimed in claim 2, wherein said coupling compound is a substituted silane.

13. Method as claimed in claim 2, wherein said coupling compound is a low-molecular-weight substituted silicone.

14. Method as claimed in claim 2, wherein said coupling compound is applied in alcohol or xylene.

15. Method as claimed in claim 14, wherein said coupling compound is present in a concentration of about 0.1 to 20 weight-percent.

16. Method as claimed in claim 15, wherein said coupling compound is present in a concentration of about 5 weight-percent.

17. Method as claimed in claim 14, wherein said coupling compound is applied first to said semiconductor body and then said coating is applied over the coupling compound followed by curing.

18. Method as claimed in claim 2, further comprising mixing the coupling compound with the polymer coating, then applying the mixture to the semiconductor body, followed by curing.

19. Method as claimed in claim 18, wherein the coupling compound is present at about 0.01 to 10 weight-percent, based on the total mixture.

20. Method as claimed in claim 19, wherein the coupling compound is present at about 0.15 weight-percent, based on the total mixture.

21. Method as claimed in claim 2, wherein said coupling compound is

γ-aminopropyl-triethoxy-silane which contains an amino, $—NH_2$, as an organo-functional group and an ethoxy, $—OC_2H_5$, as an anorgano-functional group.

22. Method as claimed in claim 2, wherein said coupling compound is

γ-glycidoxypropyl-trimethoxy-silane which contains an epoxy,

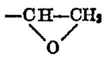

as an organo-functional group and a methoxy, $—O—CH_3$, as an anorgano-functional group.

(References on following page)

References Cited

UNITED STATES PATENTS

| | | | |
|---|---|---|---|
| 3,684,592 | 8/1972 | Chang et al. | 117—201 X |
| 2,913,358 | 11/1959 | Harrington et al. | 117—200 |
| 3,097,977 | 7/1963 | Amick et al. | 148—6.14 |
| 3,447,975 | 6/1969 | Bilo et al. | 117—218 X |
| 3,481,815 | 12/1969 | Barry et al. | 117—126 GS X |
| 3,472,729 | 10/1969 | Sterman et al. | 117—126 GS X |
| 3,465,015 | 9/1969 | Speier | 117—124 F X |
| 3,554,952 | 1/1971 | Pleuddemann | 117—124 F X |
| 3,527,655 | 9/1970 | Ballard | 117—124 F X |
| 3,524,900 | 8/1970 | Gibbon et al. | 117—124 F X |
| 2,937,110 | 5/1960 | John | 117—218 X |
| 3,586,554 | 6/1971 | Couture et al. | 117—218 X |

FOREIGN PATENTS

| | | |
|---|---|---|
| 269,947 | 4/1969 | Austria. |

RALPH HUSACK, Primary Examiner

U.S. Cl. X.R.

29—588; 117—118, 201; 148—33.3